United States Patent
Tano et al.

(10) Patent No.: US 8,173,997 B2
(45) Date of Patent: May 8, 2012

(54) LAMINATED STRUCTURE, ELECTRONIC ELEMENT USING THE SAME, MANUFACTURING METHOD THEREFOR, ELECTRONIC ELEMENT ARRAY, AND DISPLAY UNIT

(75) Inventors: Takanori Tano, Kanagawa (JP); Koei Suzuki, Kanagawa (JP); Yusuke Tsuda, Fukuoka (JP)

(73) Assignee: Ricoh Company, Ltd., Tokyo (JP)

( * ) Notice: Subject to any disclaimer, the term of this patent is extended or adjusted under 35 U.S.C. 154(b) by 380 days.

(21) Appl. No.: 12/067,825

(22) PCT Filed: Jul. 19, 2007

(86) PCT No.: PCT/JP2007/064628
§ 371 (c)(1),
(2), (4) Date: Mar. 24, 2008

(87) PCT Pub. No.: WO2008/018296
PCT Pub. Date: Feb. 14, 2008

(65) Prior Publication Data
US 2009/0261320 A1    Oct. 22, 2009

(30) Foreign Application Priority Data
Aug. 7, 2006  (JP) .................................. 2006-214684

(51) Int. Cl.
*H01L 35/24*    (2006.01)
(52) U.S. Cl. ....... 257/40; 257/59; 257/72; 257/E27.001; 257/E51.001
(58) Field of Classification Search .................... 257/40, 257/59, 72, E27.001, E51.001
See application file for complete search history.

(56) References Cited

U.S. PATENT DOCUMENTS

| | | | |
|---|---|---|---|
| 6,734,029 B2 * | 5/2004 | Furusawa ........................ 438/22 |
| 6,919,158 B2 * | 7/2005 | Kawamura et al. ......... 430/270.1 |
| 2004/0043334 A1 * | 3/2004 | Kobayashi et al. ........... 430/315 |
| 2004/0238816 A1 | 12/2004 | Tano et al. |
| 2005/0009327 A1 * | 1/2005 | Yoshida et al. ............... 438/661 |
| 2005/0194588 A1 * | 9/2005 | Sasaki et al. .................... 257/40 |
| 2007/0262421 A1 * | 11/2007 | Lehman et al. ............... 257/642 |

FOREIGN PATENT DOCUMENTS

| | | |
|---|---|---|
| JP | 2003 243660 | 8/2003 |
| JP | 2004 99874 | 4/2004 |
| JP | 2004 107625 | 4/2004 |

(Continued)

OTHER PUBLICATIONS

31p-YY-5 IJ Formation of Organic TFI's Narrow Channel, Using UV Patterned Alignment Thin Film: The Japan Society of Applied Physics, The 52$^{nd}$ Spring Meeting, Meeting Proceedings, p. 1510, 2005 (with English translation).

(Continued)

*Primary Examiner* — Anthony Ho
(74) *Attorney, Agent, or Firm* — Oblon, Spivak, McClelland, Maier & Neustadt, L.L.P.

(57) ABSTRACT

A disclosed laminated structure includes a substrate; a wettability varying layer formed on the substrate, the wettability varying layer including a material whose critical surface tension is changed by receiving energy; and an electrode layer formed on the wettability varying layer, the electrode layer forming a pattern based on the wettability varying layer. The material whose critical surface tension is changed by receiving energy includes a polymer including a primary chain and a side chain, the side chain including a multi-branched structure.

11 Claims, 4 Drawing Sheets

FOREIGN PATENT DOCUMENTS

| | | |
|---|---|---|
| JP | 2004 107651 | 4/2004 |
| JP | 2005 39086 | 2/2005 |
| JP | 2005 72200 | 3/2005 |
| JP | 2005 75962 | 3/2005 |
| JP | 2006 60113 | 3/2006 |
| WO | WO2005/022664 | 3/2005 |

OTHER PUBLICATIONS

Supplementary European Search Report issued Feb. 3, 2011, in corresponding European patent application No. 07768480.1, filed Jul. 19, 2007.

* cited by examiner

LAMINATED STRUCTURE, ELECTRONIC ELEMENT USING THE SAME, MANUFACTURING METHOD THEREFOR, ELECTRONIC ELEMENT ARRAY, AND DISPLAY UNIT

TECHNICAL FIELD

The present invention relates to organic transistors, and more particularly to a laminated structure suitable for a field-effect type organic thin-film transistor having an organic semiconductor layer, an electronic element such as an organic thin-film transistor using the laminated structure, a manufacturing method therefor, an electronic element array, and a display unit.

BACKGROUND ART

In recent years and continuing, organic thin-film transistors using organic semiconductor materials are under intense study. The advantages of using organic semiconductor materials in transistors are flexibility, larger areas, simplification of a process due to a simple layer structure, and an inexpensive manufacturing device.

Furthermore, a printing method is employed so that manufacturing costs are significantly reduced compared to conventional Si-based semiconductor devices. Moreover, thin films and circuits can be formed simply and conveniently by employing the printing method, a spin coating method, and a dipping method.

One of the parameters indicating properties of such an organic thin-film transistor is the Ion/Ioff ratio of electric current. In an organic thin-film transistor, the electric current (Ids) flowing between source/drain electrodes in the saturation region can be expressed by the following formula (1), $$I_{ds} = \frac{\mu C_{in} W (V_G - V_{TH})^2}{2L} \quad (1)$$

where the field-effect mobility is ($\mu$), the capacitance per unit area of a gate insulating film is $C_{in} = \epsilon \epsilon_0 / d$, where $\epsilon$ is the relative dielectric constant of the gate insulating film, $\epsilon_0$ is the dielectric constant of a vacuum, and d is the thickness of the gate insulating film, the channel width is (W), the channel length is (L), the gate voltage is ($V_G$), and the threshold voltage is ($V_{TH}$).

This formula indicates that, in order to increase the on current, it is effective to (1) increase the mobility, (2) decrease the channel length even more, and (3) increase the channel width. Furthermore, the field-effect mobility is largely dependent on material properties, and therefore, materials for increasing the mobility are being developed.

Meanwhile, the channel length results from the element construction, and therefore, the element construction has been devised in an attempt to increase the on current.

Generally, the channel length is reduced by reducing the distance between source/drain electrodes (electrode interval).

Organic semiconductor materials originally do not have high mobility, and therefore, the channel length is required to be no more than 10 $\mu$m, more preferably 5 $\mu$m or less.

One method of accurately setting a short distance between the source/drain electrodes is photolithography, which is employed in an Si process, including the following steps. (1) Apply a photoresist layer on a substrate with a thin-film layer (resist application). (2) Remove the solvent by heating (pre-baking). (3) Irradiate ultraviolet rays through a hard mask having a pattern rendered thereon with a laser beam or an electron beam based on pattern data (exposure). (4) Remove the exposed resist with an alkaline solution (developing). (5) Harden the resist of the unexposed part (referred to as pattern part) by heating (postbaking). (6) Dip into etching liquid or expose to etching gas to remove the thin-film layer of portions without resist (etching). (7) Remove the resist with an alkaline solution or an oxygen radical (resist separation). The aforementioned steps are repeated each time after a thin-film layer is formed, to thereby complete an active component. However, the overall costs are increased due to expensive facilities and a time-consuming process.

Meanwhile, other attempts are being made to form electrode patterns by a printing method using an inkjet apparatus in order to reduce the cost.

In inkjet printing, the electrode pattern can be directly rendered, and therefore, the material utilization rate is high. Thus, the manufacturing process may be simplified and costs may be reduced. However, the jetting precision of inkjet printing is limited due to the difficulty in reducing the amount of jetted ink and machine errors. Thus, it is difficult to form patterns of 30 $\mu$m or less, and it is impossible to make the electrode interval as short as 5 $\mu$m. This means that it is difficult to manufacture a high-precision device with an inkjet apparatus alone. Accordingly, some device is necessary to attain high precision. One approach is to perform work on the surface onto which ink is jetted.

For example, there is a method of using a gate insulating film made of a material whose critical surface tension (also referred to as surface free energy) changes by receiving energy such as ultraviolet rays (see Patent Document 1). Ultraviolet rays are irradiated through a mask only onto the portions where the electrodes are supposed to be fabricated, to create high surface free energy portions on the surface of the insulating film. An electrode material including water-soluble ink is inkjetted onto these portions, so that electrodes are fabricated only on the high energy portions. Accordingly, high-precision electrode patterns can be formed on the gate insulating film. By employing this method, even if ink droplets are jetted onto a borderline between the high surface free energy portion and a low surface free energy portion, the droplets can move over to the high energy side due to the difference in energy. As a result, it is possible to create patterns with uniform lines. This method is advantageous in that an electrode interval of 5 $\mu$m or less can be realized. However, ultraviolet rays, more specifically, ultraviolet-C rays having a short wavelength of 300 nm or less are irradiated onto the gate insulating film, and therefore, the insulating film is affected and the insulating properties become degraded.

In another example, the gate insulating film is laminated with a film made of a material whose surface free energy changes by receiving ultraviolet rays (see Non-patent Literature 1). By the same method as that of Patent Document 1, portions with different levels of surface free energy are created on the film by irradiating ultraviolet rays, and electrode patterns are created by an inkjet method. The advantage of this technique is that functions are separated into the layer in which the insulating properties are retained and the layer in which the surface free energy changes. However, because ultraviolet rays are irradiated on the gate insulating film, there still remains the problem that the insulating film is affected and the insulating properties are degraded. As a result, gate leakage is increased and it is only possible to produce a device having a small Ion/Ioff ratio.

Non-patent Literature 1 reports an attempt of mitigating this problem by increasing the thickness of the gate insulating film (approximately 1 $\mu$m) in order to reduce the amount of ultraviolet rays being transmitted to the substrate layer. However, as indicated by formula 1, if the thickness of the gate insulating film is increased, the extracted current value Ids is decreased. As a result, it is only possible to produce a device having a small Ion/Ioff ratio.

Consequently, it is necessary to increase the applied voltage $V_G$ in order to increase the Ion/Ioff ratio. As a result, it is difficult to produce a low power consuming device.

Patent Document 1: Japanese Laid-Open Patent Application No. 2005-310962

Non-patent Literature 1: The Japan Society of Applied Physics, The 52nd Spring Meeting, 2005, Meeting proceedings, p. 1510

As described above, by the method of fabricating portions of high surface free energy and portions of low surface free energy on a gate insulating film with ultraviolet rays or electron beams, it is possible to fabricate high-precision and high-density electrode patterns that are difficult to fabricate by the conventional printing method. However, a problem arises in that the insulating properties of the gate insulating film become degraded by receiving high energy light beams. Therefore, it is necessary to mitigate the adverse effects caused by irradiating high energy light beams.

Accordingly, there is a need for a laminated structure, an electronic element using the same, a manufacturing method therefor, an electronic element array, and a display unit, in which insulating properties of a gate insulating film are not degraded even if high energy light beams are irradiated on the gate insulating film.

DISCLOSURE OF THE INVENTION

The present invention provides a laminated structure, an electronic element using the same, a manufacturing method therefor, an electronic element array, and a display unit in which one or more of the above-described disadvantages are eliminated.

An embodiment of the present invention provides a laminated structure including a substrate; a wettability varying layer formed on the substrate, the wettability varying layer including a material whose critical surface tension is changed by receiving energy; and an electrode layer formed on the wettability varying layer, the electrode layer forming a pattern based on the wettability varying layer, wherein the material whose critical surface tension is changed by receiving energy includes a polymer including a primary chain and a side chain, the side chain including a multi-branched structure.

An embodiment of the present invention provides a method of manufacturing a laminated structure, the method including the steps of forming a high surface energy portion and a low surface energy portion on a wettability varying layer by applying energy onto the wettability varying layer in such a manner that critical surface tension of a material in the wettability varying layer changes; and forming a conductive layer on the high surface energy portion by applying a liquid including a conductive material on the high surface energy portion, wherein the material whose critical surface tension is changed by receiving the energy includes a polymer including a primary chain and a side chain, the side chain including a multi-branched structure.

An embodiment of the present invention provides a method of manufacturing an electronic element, the method including the steps of forming a gate electrode; forming a source electrode; forming a drain electrode; forming a semiconductor layer; and forming an insulating layer, wherein at least one of the steps of forming the gate electrode, the source electrode, and the drain electrode further includes the steps of forming a high surface energy portion and a low surface energy portion on a wettability varying layer by applying energy onto the wettability varying layer in such a manner that critical surface tension of a material in the wettability varying layer changes; and forming a conductive layer on the high surface energy portion by applying a liquid including a conductive material on the high surface energy portion, wherein the material whose critical surface tension is changed by receiving the energy includes a polymer including a primary chain and a side chain, the side chain including a multi-branched structure.

According to one embodiment of the present invention, there are provided a laminated structure, an electronic element using the same, a manufacturing method therefor, an electronic element array, and a display unit in which insulating properties of a gate insulating film are not degraded even if high energy light beams are irradiated on the gate insulating film.

BRIEF DESCRIPTION OF THE DRAWINGS

FIGS. 5A, 5B illustrate an example of an electronic element array.

BEST MODE FOR CARRYING OUT THE INVENTION

A description is given, with reference to the accompanying drawings, of an embodiment of the present invention.

[Laminated Structure]

Figure 1:
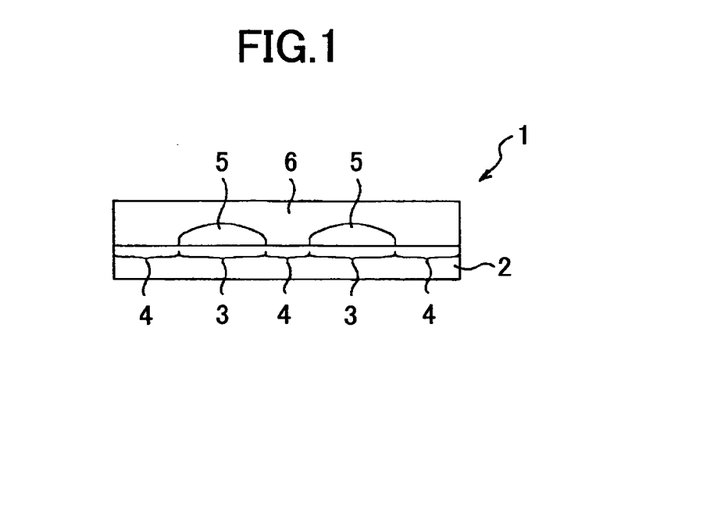
FIG. 1 is a sectional schematic view of a laminated structure according to an embodiment of the present invention.

A description is given of a laminated structure according to an embodiment of the present invention. FIG. 1 is a sectional schematic view of a laminated structure 1 according to an embodiment of the present invention. The laminated structure 1 includes a wettability varying layer 2 acting as the base, which is formed on a substrate (not shown). The wettability varying layer 2 is made of a material whose critical surface tension is changed by receiving energy. In the present embodiment, the wettability varying layer 2 includes portions that differ in at least the critical surface tension, namely, high surface energy portions 3 with higher critical surface tension and low surface energy portions 4 with lower critical surface tension. Between the two high surface energy portions 3 shown in FIG. 1, there are microscopic gaps that fall in a range of approximately 1 μm through 5 μm. Conductive layers 5 are formed on the wettability varying layer 2 at the high surface energy portions 3. A semiconductor layer 6 is provided on the wettability varying layer 2 in such a manner as to contact at least the low surface energy portions 4.

[Wettability Varying Layer]

A description is given of the material whose critical surface tension is changed by receiving energy, which material is included in the wettability varying layer.

The material whose critical surface tension is changed by receiving energy, which material is included in the wettability varying layer of the laminated structure according to an embodiment of the present invention, has a characteristic of reducing the amount of irradiated ultraviolet rays.

In general, it is impossible to change the surface free energy unless high energy light such as ultraviolet rays are irradiated. Thus, the material whose critical surface tension is changed by receiving energy, which material is included in the wettability varying layer of the laminated structure according to an embodiment of the present invention, is used for reducing the amount of irradiated ultraviolet rays.

A detailed description is given of the mechanism for changing the surface free energy by irradiating ultraviolet rays.

When a light beam having a wavelength of 300 nm or less is irradiated, a C=O (carbonyl group) included in the high polymer side chain is photodecomposed, and a radical of C=O is generated. Because the radical has high reactivity, it immediately reacts to moisture included in the atmosphere, thereby generating COOH (carboxyl group). Due to this carboxyl group, the surface becomes hydrophilized. Accordingly, by employing this mechanism, the following molecular design is possible. Specifically, an ester binding is introduced into part of the side chain having a water-repellent structure, such as hydrocarbons or hydrogen fluoride, preferably near the principal chain. That is, the ester binding is introduced into a part near the principal chain of the side chain coming out of the principal chain. Beyond this part, i.e., at parts of the side chain further away from the principal chain, a long chain including water-repellent groups such as hydrocarbons or hydrogen fluoride is fabricated. The group can be another functional group as long as a double binding of the C=O is included. A film made of such molecules has a surface that is water-repellent because the side chain does not break unless ultraviolet rays are irradiated. When ultraviolet rays are irradiated, the portion of the ester binding is broken. As a result, the long chain such as a hydrocarbon chain or a hydrogen fluoride chain extending therebeyond is broken. Consequently, a carboxyl group is generated so that the surface becomes hydrophilized.

In an embodiment of the present invention, in order to improve the luminous sensitivity, a high polymer including a principal chain and a side chain with a multi-branched structure is used as the material whose critical surface tension is changed by receiving energy.

One ester binding is decomposed by one photon, and therefore, it is preferable to have two or more hydrocarbon chains or hydrogen fluoride chains attached to each ester binding, i.e., provide a multi-branched structure. Accordingly, with a small amount of irradiating energy, the surface free energy can be largely changed. The multi-branched structure can be either a dendrimer structure or a hyperbranched structure; however, a dendrimer structure is more preferable. A dendrimer structure refers to a structure in which the chains are branched in a symmetrical manner from a center molecule. Meanwhile, a hyperbranched structure has various branching degrees and polymerization degrees resulting from polymerizing an AB2 type monomer, that is, the chains are branched randomly. Definitions of a dendrimer structure and a hyperbranched structure are described in detail in, e.g., "Dedritic high polymers" edited by Keigo Aoi and Masaaki Kakimoto, published by NTS Inc.

In the laminated structure according to an embodiment of the present invention, the material whose critical surface tension is changed by receiving energy included in the wettability varying layer is characterized in that insulating properties are retained even if ultraviolet rays are irradiated.

Typically, the reason why insulating properties are degraded by receiving ultraviolet rays is that not only the side chain but also the primary chain is broken by ultraviolet rays. In order to prevent this, one approach is to introduce into the primary chain, a group that does not absorb ultraviolet rays (group including a sigma binding, e.g., a vinyl group or a framework including Si—O such as siloxane). However, as indicated by properties of polyvinyl, polyvinyl phenol, or a high polymer with a siloxane structure, a polymer with such a framework does not have good insulating properties. Looking at the three-dimensional structure, the structure is not rigid, and therefore, the packing is poor and a dense structure cannot be made. Thus, insulating properties cannot be retained simply by introducing a group that does not absorb ultraviolet rays into the primary chain. Another approach is to make the primary chain long (increase the average number of molecules), so that the primary chain is long enough to retain insulating properties even after being broken by ultraviolet rays. However, if the primary chain is made long, i.e., the average number of molecules is increased, the solubility into solvents is degraded. As a result, the film formability is degraded. Thus, it is not possible to simply make the primary chain long or increase the average number of molecules. Another approach is to introduce a material with a high absorption coefficient that can absorb ultraviolet rays well; however, there are no organic materials with a high absorption coefficient. Thus, the resolution is to make the film considerably thick or to use an inorganic material (e.g., $TiO_2$) that has a higher absorption coefficient than organic materials.

In the case of using an inorganic material, the thin film cannot be formed with the inorganic material alone. Therefore, particles of the inorganic material need to be dispersed in a polymer. However, inorganic particles such as $TiO_2$ can only be made as small as approximately 1 µm. For this reason, in order to sufficiently disperse the particles inside a polymer film, the thickness of the film needs to be several microns. Consequently, the voltage applied needs to be increased.

Accordingly, in the wettability varying layer of the laminated structure according to an embodiment of the present invention, a polyimide framework that has a rigid primary chain is introduced. Because the polyimide framework has a rigid primary chain, even if the chain is broken to some degree, the packing between molecules can be retained. There are two types of polyimide. One type is a thermosetting type polyimide that is generated by heating polyamic acid so that dehydration condensation reaction is caused. The other type is soluble type polyimide that is already dissolved in a solvent. With the soluble type polyimide (also referred to as soluble polyimide), a preferable film can be formed by evaporating the solvent by heat after application. Meanwhile, the thermosetting type polyimide generally needs to be heated to a high temperature (200° C. or more), because the dehydration condensation reaction does not occur unless it is heated to this extent.

Accordingly, the soluble polyimide is preferably employed as the high polymer including a principal chain and a side chain with a multi-branched structure used as the material whose critical surface tension is changed by receiving energy in the wettability varying layer of the laminated structure, because soluble polyimide is highly insulating and solvent-resistant without applying high heat.

The composition of materials of the wettability varying layer 2 is described in detail with reference to FIG. 1.

The wettability varying layer 2 can be made from one type of material or two or more types of materials. To form the wettability varying layer 2 with two or more types of materials, specifically, a material with high electrical insulating properties is mixed with a material whose wettability varies greatly. As a result, it is possible to provide a wettability varying layer 2 with excellent electric insulating properties and excellent wettability variation properties. Examples of the material with high electrical insulating properties are polyimide, polyamide-imide, epoxy, silsesquioxane, polyvinyl phenol, polycarbonate, fluororesin, and polyparaxylene. Alternatively, a crosslinking agent can be added to polyvinyl phenol or polyvinyl alcohol. The material with high electrical insulating properties preferably has a hydrophobic group on the side chain. For example, a side chain with a hydrophobic group is bound directly or via a binding group to a primary chain having a framework of polyimide, polyimide-amide, or methacrylate. Examples of the hydrophobic group have end structures such as $-CF_2CH_3$, $-CF_2CF_3$, $-CF(CF_3)_2$, and —CFH$_2$. Polyimide with an alkyl side chain is described in "Development of new polyimide and technology of providing advanced functions for next-generation electronics and electronic materials" published by Technical Information Institute Co., Ltd.

It is possible to use a material that varies greatly in wettability but has problems in terms of film formability, and therefore, the material can be selected from a wider range of options. For example, there may be a case where one of the materials varies greatly in wettability but has high cohesive power, thus degrading film formability. By mixing this material with another material having good film formability, the wettability varying layer can be fabricated easily.

As described above, the wettability varying layer 2 is made of a material whose critical surface tension is changed by receiving energy such as heat, ultraviolet rays, electron beams, and plasma. Preferably, the amount of critical surface tension is changed greatly before and after applying the energy. On such a material, energy is applied to parts of the wettability varying layer 2 in such a manner as to form patterns with different levels of critical surface tension, i.e., the high surface energy portion 3 and the low surface energy portion 4. Thus, liquid including a conductive material easily adheres to the high surface energy portion 3 (lyophilic) but does not easily adhere to the low surface energy portion 4 (lyophobic). Accordingly, liquid including the conductive material selectively adheres to the lyophilic high surface energy portion 3 in accordance with the pattern shapes, and the adhered liquid is solidified, thereby forming the conductive layers 5.

The thickness of the wettability varying layer 2 according to an embodiment of the present invention preferably falls in a range of 30 nm through 3 μm, more preferably in a range of 50 nm through 1 μm. If the wettability varying layer 2 is any thinner, properties as a bulk body are degraded (insulating properties, gas barrier properties, and moisture barrier properties). If the wettability varying layer 2 is any thicker, the surface shape is degraded.

A description is given of the gate insulating film and the laminated structure.

The gate insulating film and the laminated structure are laminated together; however, if the wettability varying layer 2 has good insulating properties, the wettability varying layer 2 can also act as the gate insulating film.

If so, the gate insulating film can be omitted.

If both the gate insulating film and the laminated structure are provided, the wettability varying layer 2 is preferably made of a material that has a higher absorption coefficient than that of a material forming a high insulating layer, in order to prevent an adverse effect caused by irradiating ultraviolet rays.

The gate insulating film is made of a material with higher insulating properties than that of the wettability varying layer 2.

If insulating properties are higher, it means that the volume resistance is greater.

If a wettability control layer is laminated on a high insulating layer, and the wettability control layer contacts the source/drain electrodes, there can be three or more layers provided. A high insulating layer can also act as the wettability control layer.

A description is given of the materials of the gate insulating film.

The insulating film can be made of materials such as polyimide, polyamide-imide, epoxy, silsesquioxane, polyvinyl phenol, polycarbonate, fluororesin, and polyparaxylene.

[Multi-Branched Structure]

According to an embodiment of the present invention, the side chain can include the following multi-branched structure. The alkyl long chain and the hydrogen fluoride long chain can be molecule chains other than the examples below. The multi-branched structure can be any structure other than the examples below.

In the following chemical structural formulae 1 through 8, n is an integer number 2 through 16. In consideration of solubility into solvents, n is particularly preferably 4 through 12.

The long chain is of a first generation in the example below; however, the long chain can be of a second generation or more as indicated in the chemical structural formulae 5 through 8.

Chemical structural formula 1

Chemical structural formula 2

Chemical structural formula 3

Chemical structural formula 4

-continued

Chemical structural formula 5

Chemical structural formula 6

Chemical structural formula 7

Chemical structural formula 8

[Soluble Polyimide]

In order to perform the film formation process at a low temperature, the high polymer material having a hydrophobic group in the side chain preferably includes soluble polyimide. Soluble polyimide is polyimide that is soluble into a solvent. Soluble polyimide is made by performing in advance a chemical imidization process on polyamic acid in a solution. The polyamic acid is obtained by making polyamic acid dianhydride react with diamine, which are the materials. If the polyimide framework has a rigid structure, it does not easily dissolve in a solvent. Accordingly, in order to disrupt the crystallinity of the polyimide and to facilitate dissolution, an alicyclic cyclocarboxylic dihydrate having a high height is generally used.

It is possible to estimate the type of acid anhydride included in polyimide by analyzing the oscillation of a characteristic group caused by the infrared absorption spectral properties of the polyimide thin film and/or by measuring the ultraviolet-visible absorption spectral properties. A polyimide thin film including alicyclic cyclocarboxylic dihydrate having a high height would have an absorption edge wavelength of 300 nm or less. Details are described in "Latest Polyimide—Basics and Application—" written by Toshio Imai and Rikio Yokota, edited by Japan Polyimide Association, published by NTS Inc. in 2002, and "Development of new polyimide and technology of providing advanced functions for next-generation electronics and electronic materials" published by Technical Information Institute Co., Ltd. in 2003.

Because polyimide is dissolved in a solvent, film formation is possible at a low temperature of 200° C. or less, which is the temperature at which a solvent evaporates. Furthermore, unreacted polyamic acid does not remain in the polyimide thin film or a side reaction product such as acid anhydride does not remain in the polyimide. This mitigates failures in electric properties of the polyimide film caused by such impurities.

Soluble polyimide is not soluble in all solvents; it is only soluble in solvents with high polarity such as γ-butyl lactone, N-methylpyrrolidone, and N,N-dimethylacetamide. Accordingly, by forming a semiconductor layer on the wettability varying layer 2 with a solvent with low polarity such as toluene, xylene, acetone, and isopropyl alcohol, it is possible to prevent the thin film including soluble polyimide from being eroded by the solvent.

In a case of forming the wettability varying layer 2 with two or more types of materials, the material other than soluble polyimide having a hydrophobic group in the side chain is also preferably a soluble material. Accordingly, film formation is possible under low temperature. Furthermore, the material preferably indicates good compatibility with soluble polyimide. Accordingly, phase separation in a solvent can be mitigated, and the materials are optimum for the film formation process.

The soluble material need not be organic; the soluble material can be a compound including organic and inorganic substances. Examples are phenolic resin such as polyvinyl phenol, melamine resin, polysaccharide such as pullulan treated by an acetylation process, and silsesquioxane.

Furthermore, if the material other than soluble polyimide having a hydrophobic group in the side chain also includes soluble polyimide, it is preferable in terms of heat resistance, solvent resistance, and affinity.

[Electrode Layer (Conductive Layer)]

The electrode layer (conductive layer) 5 is made by solidifying liquid preferably including a conductive material by applying heat or irradiating ultraviolet rays. The liquid including a conductive material refers to any of the following.
1. Conductive material is dissolved in a solvent.
2. Precursor of conductive material or precursor dissolved in a solvent.
3. Particles of conductive material are dispersed in a solvent.
4. Precursor particles of conductive material are dispersed in a solvent.
More specific examples are metal microparticles such as Ag, Au, or Ni dispersed in an organic solvent or water, or a solution of a conductive polymer such as doped PANI (polyaniline) or PSS (polystyrene sulfonate) doped in PEDOT (polyethylenedioxythiophene).

Examples of a method of applying liquid including a conductive material on the surface of the wettability varying layer 2 are a spin coating method, a dip coating method, a screen printing method, an offset printing method, and an inkjet method. However, to make more use of the effects of the surface energy on the wettability varying layer 2, the inkjet method is particularly preferable because small liquid droplets can be supplied. As described above, when a head that is typically used in a printer is employed in the inkjet method, the resolution is approximately 30 μm and the alignment precision is around ±15 μm. However, by making use of the difference in surface energy on the wettability varying layer 2, it is possible to form finer patterns.

[Semiconductor Layer]

The semiconductor layer 6 can include an inorganic semiconductor or an organic semiconductor. Examples of an inorganic semiconductor are CdSe, CdTe, and Si. Examples of an organic semiconductor are organic low molecules such as pentacene, anthracene, tetracene, and phthalocyanine; polyphenylene-based conductive high polymers such as a polyacethylene-based conductive high polymer, polyparaphenylene and a derivative thereof, and polyphenylene vinylene and a derivative thereof; heterocyclic series conductive high polymers such as polypyrrole and a derivative thereof, polythiophene and a derivative thereof, and polyfuran and a derivative thereof; and an ionic conductive high polymer such as a polyaniline and a derivative thereof. By employing an organic semiconductor as described above, effects of properties of the wettability varying layer 2 can be enhanced more significantly.

PRACTICAL EXAMPLES

The following practical examples are for specifically describing the present invention; however, the present invention is not limited to these practical examples.

Practical Example 1

In practical example 1, it was confirmed that in a film made from a dendrimer material, a dendrimer was present, and that the surface free energy can be changed by irradiating less ultraviolet rays compared to conventional materials.

First, it was confirmed that a dendrimer was present in the film formed by applying the material.

A polyimide material (polyimide A) having a dendrimer in the side chain and a solution of polyimide (polyimide B) without a dendrimer were respectively applied on glass substrates by a spin coating method. Next, the substrates were heated in an oven at a temperature of 180° C., and the solvents were removed. The resultant film thicknesses were measured with a sensing pin, and both were 100 nm. A portion of each of the films was scraped off and dissolved into CDCl3 that is an isotope of chloroform. Then, the 1H-NMR was measured.

Upon comparing the resultant chart with that of polyimide A that is the material, it was found that they were substantially the same. This means that the dendrimer structure remained without being decomposed even after heating the applied film.

Furthermore, when the scraped off part of the film was put into a thermogravimetric analyzer, it was confirmed that the weight changed rapidly (approximately 20% by weight) at approximately 450° C. This value was the same as the proportion of the dendrimer structure including the hydrocarbon long chain with respect to the total molecular weight of polyimide A. Accordingly, it can also be confirmed from this result that the dendrimer structure is present in the film.

Next, variations in the contact angle with respect to irradiation of ultraviolet rays were measured.

Figure 2:
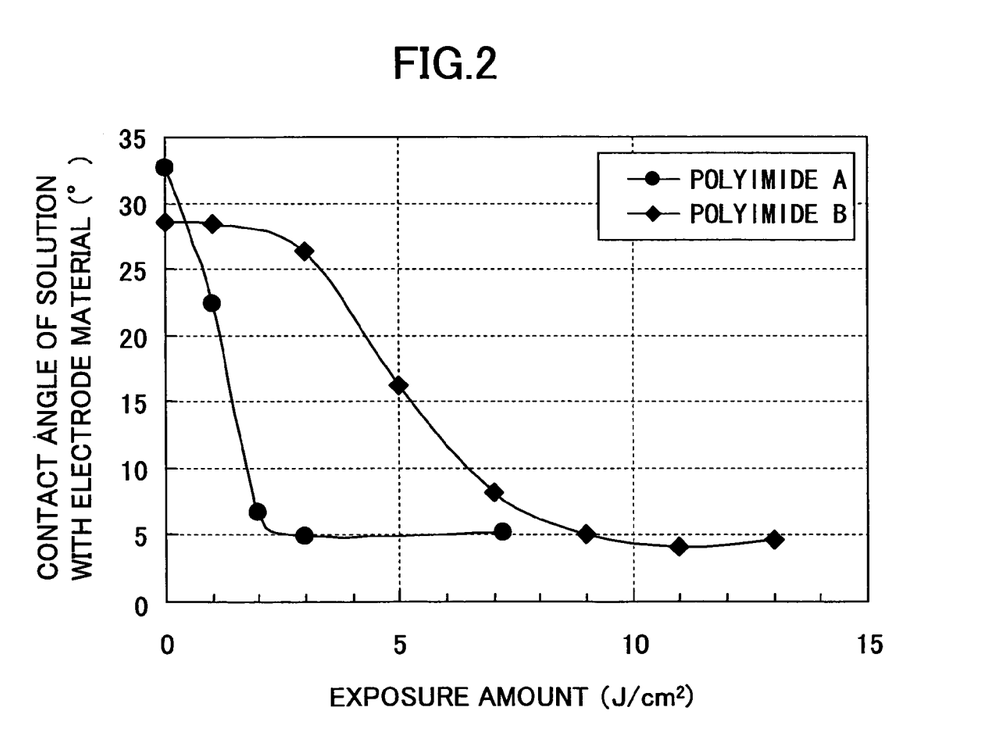
FIG. 2 is a graph indicating irradiation amounts of ultraviolet rays relative to contact angles of a solution including an electrode material.

Ultraviolet rays were irradiated onto each of the films (using an ultrahigh pressure mercury lamp). The variations in the contact angle of water and a solution including an electrode material relative to the irradiation time were measured by a sessile drop method. The results of the variations in the contact angle of a solution including an electrode material are shown in FIG. 2.

Chemical structural formula 9

(Polyimide A)

Chemical structural formula 10

(Polyimide B)

These results say that when ultraviolet rays are not irradiated, the contact angle is larger in polyimide A including a dendrimer structure than in polyimide B. Similar results were obtained in the case of pure water.

When ultraviolet rays are irradiated, it was found that the contact angle in pure water and in a solution with an electrode material decreases as the exposure amount increases in polyimide A and B. In the case of the solution with an electrode material, the contact angle becomes fixed at around 5°.

As described above, both in polyimide A that includes a dendrimer structure and polyimide B, the contact angle changes by irradiating ultraviolet rays, i.e., the free energy on the film surface changes. However, in order to attain the same contact angle, polyimide A requires a significantly smaller amount of ultraviolet rays compared to polyimide B, which amount is one quarter of that required by polyimide B. In this manner, by introducing a dendrimer structure in the side chain, greater variations in the surface free energy can be attained with a smaller amount of exposure.

Practical Example 2

Properties of electrode patterning were compared between polyimide A and polyimide B.

Similarly to practical example 1, polyimide A and polyimide B were respectively applied onto glass substrates to form thin films having thicknesses of 100 nm.

Ultraviolet rays were irradiated onto each of the films (using an ultrahigh pressure mercury lamp) through a line-shaped photomask in such a manner that the illuminance falls in a range 1 through 15 $J/cm^2$. Accordingly, portions with high surface energy were formed on the thin films made of polyimide A and polyimide B. Ink made of an electrode material was jetted onto the formed portions having high surface energy by an inkjet method. The electrode material is a known electrode material; specifically, the ink was made by dispersing silver nanoparticles in a water-based solution (hereinafter, "silver nano ink"). The electrode material can be gold nanoparticles or copper nanoparticles. After baking the thin films in an oven at 200° C., a metallographic microscope was used to observe whether lines having intervals of 5 μm were formed. Results are shown in Table 1.

TABLE 1

| | Exposure amount ($J/cm^2$) | | | | |
|---|---|---|---|---|---|
| | 1 | 2 | 5 | 10 | 15 |
| Polyimide A | X | ○ | ○ | ○ | ○ |
| Polyimide B | X | X | X | Δ there are portions where lines are not properly formed | ○ |

These results correspond to the results obtained by measuring the contact angles of the solution including an electrode material relative to the exposure amount of ultraviolet rays. That is, on the film made of polyimide A, an exposure amount of only 2 $J/cm^2$ is required to form a surface with a high level of surface free energy and form electrode lines. Meanwhile, on the film made of polyimide B, approximately 10 $J/cm^2$ of ultraviolet rays need to be irradiated to form a surface with a high level of energy. Furthermore, the contact angles of the portions in the film made from polyimide B that are not exposed are not as large as those in the film made from polyimide A. Consequently, on the film made from polyimide B, even with an exposure amount of 10 $J/cm^2$, a sufficient contrast cannot be obtained. As a result, there are portions where lines with intervals of 5 μm are not properly formed on the film made from polyimide B.

As described above, with polyimide A including a dendrimer structure in the side chain, it is possible to form electrodes with a smaller exposure amount compared to polyimide B.

Practical Example 3

An organic transistor was fabricated, in which a gate insulating film and a laminated structure are laminated together.

A vacuum evaporation method employing a metal mask was performed to form a film A1 on a glass substrate and fabricate a gate electrode with a film thickness of 50 nm. The polyimide A film according to practical example 1 was laminated on a parylene film having a film thickness of 400 nm to form a laminated insulating film. The film thickness of the polyimide A film was 100 nm.

Ultraviolet rays (using an ultrahigh pressure mercury lamp) were irradiated through a photomask at an illuminance of 2 $J/cm^2$ to form portions with high surface energy on the gate insulating film. Silver nanoink was jetted onto these high surface energy portions by an inkjet method, and the gate insulating film was baked at 200° C. to form a source electrode and a drain electrode with a distance of 5 μm therebetween, i.e., with a channel length of 5 μm.

As an organic semiconductor material, triallylamine that is expressed by the following chemical structural formula II was used, and film formation was performed by a spin coating method to form an organic semiconductor layer having a film thickness of 30 nm.

Chemical structural formula 11

Figure 3:
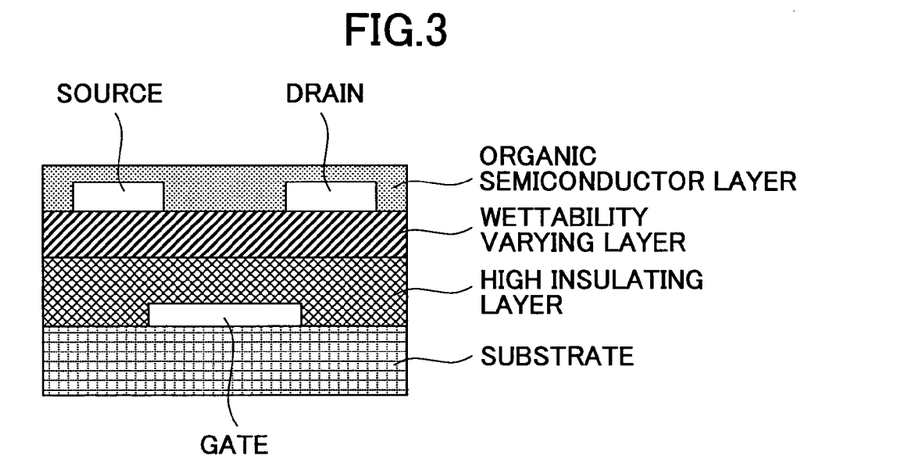
FIG. 3 is a schematic diagram of an organic transistor in which a gate insulating film is laminated in a laminated structure.

The resultant organic transistor has a structure as shown in FIG. 3, including a substrate, a gate electrode (A1), a laminated insulating film (gate insulating film), a source electrode, a drain electrode, and an organic semiconductor layer.

Comparative Example 1

An organic transistor was fabricated with polyimide B.

In the same manner as the practical example 2, a thin film made of polyimide B having a thickness of 100 nm was formed on a parylene film. Subsequently, ultraviolet rays (using an ultrahigh pressure mercury lamp) were irradiated through a photomask at an illuminance of 15 J/cm$^2$ to form portions with high surface energy on the gate insulating film. Based on the results obtained in the practical example 2, the irradiation amount was specified as 15 J/cm$^2$ so that electrode lines can be formed. Silver nanoink was jetted onto these high surface energy portions by an inkjet method, and the gate insulating film was baked at 200° C. to form a source electrode and a drain electrode with a distance of 5 μm therebetween, i.e., with a channel length of 5 μm. Film formation was performed by a spin coating method using the same organic semiconductor material as that of the practical example 2 to form an organic semiconductor layer.

[Evaluation of Organic Transistor]

Table 2 indicates the evaluation results of transistor properties of the practical example 3 and the comparative example 1.

and a drain electrode made from Au and fabricated by a vacuum evaporation method through a metal mask.

Meanwhile, the transistor made from polyimide B had a large off current, and the Ion/Ioff ratio was three digits. The field-effect mobility was in an order of 10$^{-4}$ cm$^2$/V, which was approximately two digits smaller than that of polyimide A. It is presumed that this resulted from the difference in the exposure amount of ultraviolet rays. That is, with polyimide B, ultraviolet rays need to be irradiated for a longer time to form source/drain electrodes, and therefore, it is presumed that the parylene used as the base was affected.

In this manner, with polyimide A having a dendrimer structure in the side chain, it is possible to fabricate a transistor with excellent properties.

Practical Example 4

An organic transistor was fabricated, in which the laminated structure is used for plural electrode layers.

Polyimide C, expressed by the following chemical structural formula 12, was spin coated onto a film substrate and dried/at 150° C. to form a thin film.

Chemical structural formula 12

|  | Transistor made from polyimide A | Transistor made from polyimide B |
|---|---|---|
| Ion/Ioff ratio | 5 digits | 3 digits |
| Field-effect mobility | 3 × 10$^{-3}$ cm$^2$/Vs | 3 × 10$^{-4}$ cm$^2$/Vs |

These results say that properties of electrode patterning are favorable in the transistor made from polyimide A, and an organic transistor having field-effect mobility of 3×10$^{-3}$ cm$^2$/V per second was fabricated. This value was comparable to that of an organic transistor including a source electrode The thickness was approximately 90 nm. Next, ultraviolet rays (using an ultrahigh pressure mercury lamp) were irradiated through a photomask at an illuminance of 2 J/cm$^2$ to form portions with high surface energy on the film. Silver nanoink was jetted onto these high surface energy portions by an inkjet method, and the film was baked at 150° C. to form a gate electrode.

Next, a small amount of polyimide D expressed by a chemical structural formula 13 was mixed with a solution of polyimide E expressed by a chemical structural formula 14. This mixture was spin coated onto the film, and the film was dried at 150° C. to form a gate insulating film having a thickness of 500 nm.

Chemical structural formula 13

Chemical structural formula 14

Next, ultraviolet rays (using an ultrahigh pressure mercury lamp) were irradiated through a photomask at an illuminance of 0.5 J/cm$^2$ to form portions with high surface energy on the gate insulating film. Silver nanoink was jetted onto these high surface energy portions by an inkjet method, and the gate insulating film was baked at 150° C. to form a source electrode and a drain electrode with a distance of 5 μm therebetween, i.e., with a channel length of 5 μm.

Film formation was performed in the same manner as practical example 3, using polyimide A expressed by the chemical structural formula 9 as the organic semiconductor material.

Figure 4:
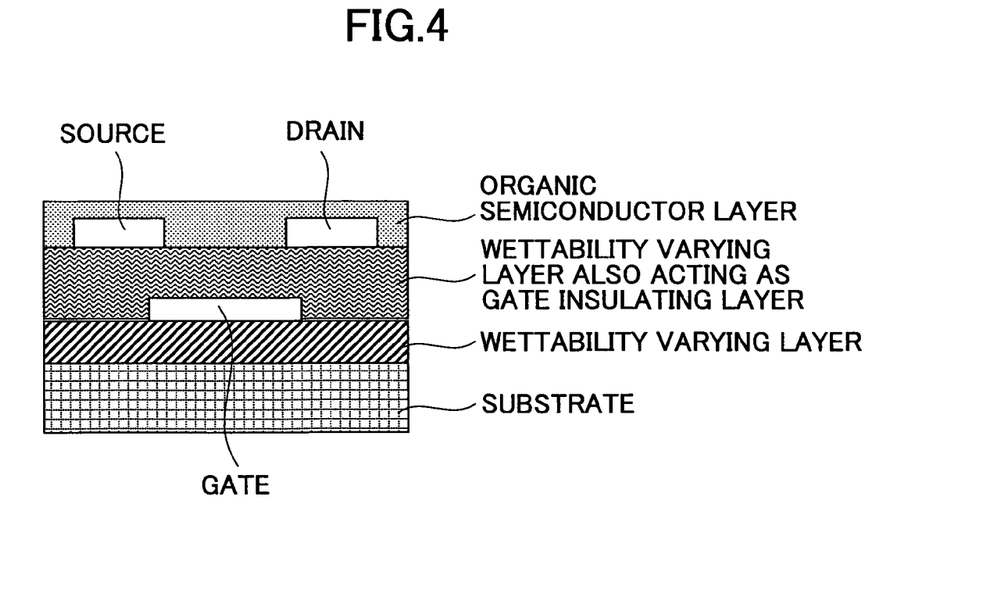
FIG. 4 is a schematic diagram of an organic transistor in which a laminated structure is used for plural electrode layers.

The resultant organic transistor has a structure as shown in FIG. 4, including a substrate, a wettability varying layer, a gate electrode, a gate insulating film also acting as a wettability varying layer, a source electrode, a drain electrode, and an organic semiconductor layer.

There were no problems in forming the gate electrode and the source/drain electrodes, and a transistor having mobility of 2×10$^{-3}$ cm$^2$/Vs was fabricated. This value was comparable to that of an organic thin film transistor including a source electrode and a drain electrode made from Au and fabricated by a vacuum evaporation method through a metal mask.

Figure 5A:
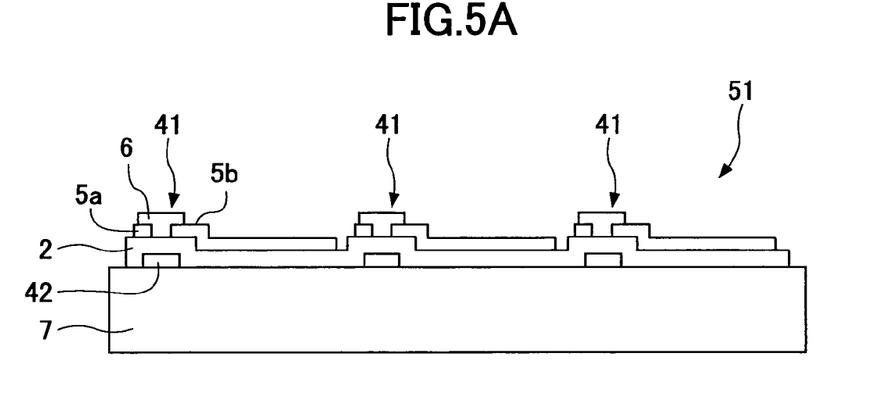
FIG. 5A is a sectional view and FIG. 5B is a plan view illustrating arrangements of electrodes.
Figure 5B:
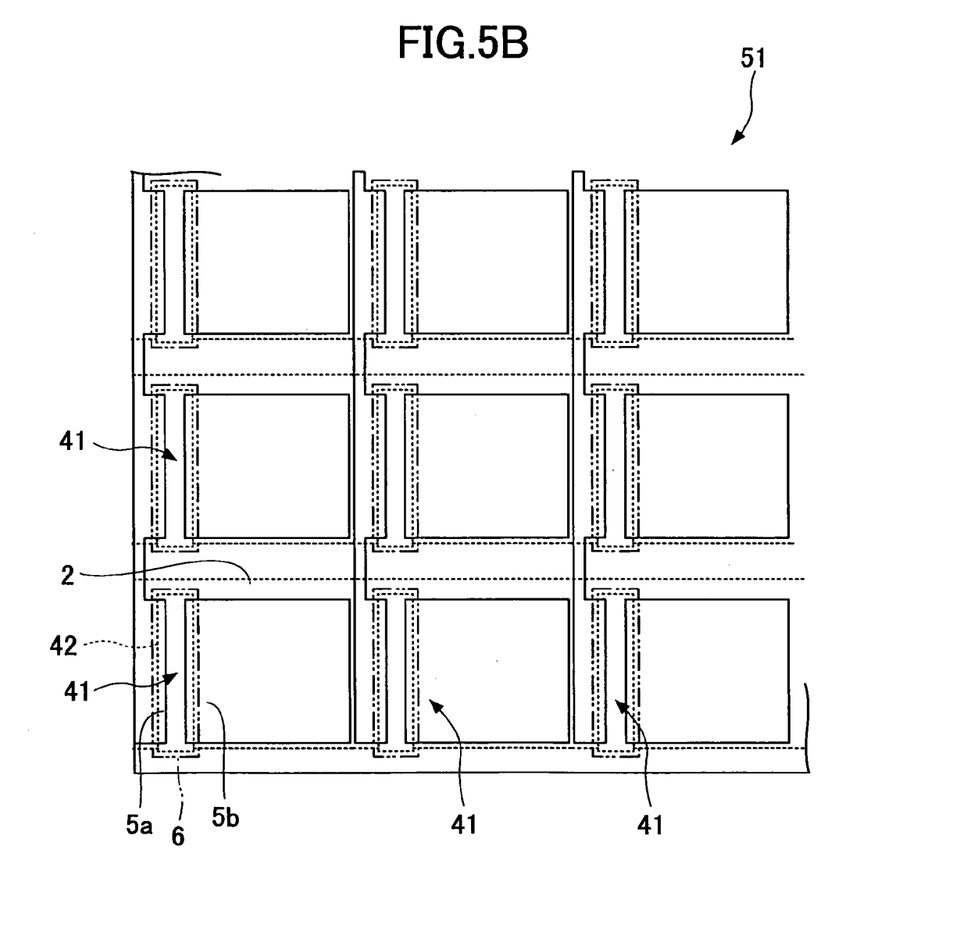

A device including plural organic transistors was fabricated (see FIGS. 5A, 5B).

A description is given of the process of fabricating an electronic element array 51 as shown in FIGS. 5A, 5B.

First, a wettability varying layer 2, and then a gate electrode 42 and a wettability varying layer 2 acting as a gate insulating film were formed on a film substrate in the same manner as practical example 4. Subsequently, a source electrode layer 5a and a drain electrode layer 5b were formed in the same manner as practical example 4. Finally, a solution in which the laminated structure (polymer) 1 is dissolved in toluene was used to form the semiconductor layer 6 in island shapes by a microcontact printing method.

By performing these steps, the electronic element array 51 including a two-dimensional array of 32×32 TFTs (electronic elements 41) formed on a substrate 7 (inter-element pitch of 500 μm) was fabricated. The average mobility of the plural TFTs (electronic elements 41) was 1.1×10$^{-3}$ cm$^2$/Vs.

Figure 6:
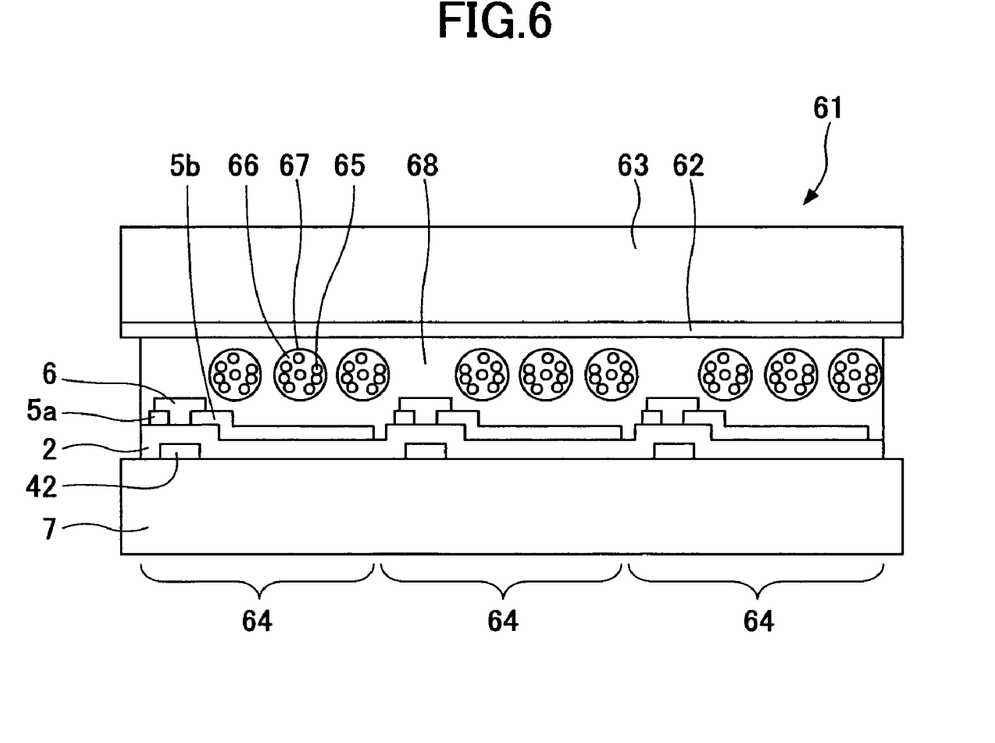
FIG. 6 is a sectional view of a display unit employing the electronic element array shown in FIGS. 5A, 5B.

Next, a display unit was fabricated (see FIG. 6).

A description is given of the process of fabricating a display unit 61 employing the electronic element array 51 shown in FIGS. 5A, 5B.

To form display elements 64, first, microcapsules 67 including titanium oxide particles 65 and Isoper 66 colored with oil blue were mixed in a PVA solution. This was applied onto a polycarbonate substrate 63 coated with a transparent electrode 62 including ITO, thereby forming a layer including the microcapsules 67 and a PVA binder 68. This substrate was bonded together with the substrate 7 on which the TFT array (electronic element array 51) is formed, which was fabricated in the practical example 4. A driver IC used for scanning signals was connected to a bus line connected to the gate electrode 42 and a driver IC used for data signals was connected to a bus line connected to the source electrode layer 5a. When the screen was switched every 0.5 seconds, favorable still images were displayed.

According to one embodiment of the present invention, the process of manufacturing a laminated structure can be simplified and performed at a reduced cost.

Further, according to one embodiment of the present invention, an electronic element such as a thin film transistor with good properties can be provided.

Further, according to one embodiment of the present invention, the process of manufacturing an electronic element such as a thin film transistor can be simplified and performed at a reduced cost.

Further, according to one embodiment of the present invention, high-precision and high-density electrode patterns can be formed on all electrode layers in an electronic element such as a thin film transistor.

Further, according to one embodiment of the present invention, the process of manufacturing an electronic element array can be simplified and performed at a reduced cost, and an active matrix substrate including a low-cost and high-performance organic thin film transistor can be provided.

Further, according to one embodiment of the present invention, by combining an active matrix substrate including an organic thin film transistor with a pixel display element, an inexpensive and highly flexible display unit can be fabricated.

Further, according to one embodiment of the present invention, a method can be provided for easily manufacturing a laminated structure including fine electrode patterns by a low-cost method at a high material utilization rate, such as a printing method.

Further, according to one embodiment of the present invention, a method can be provided for manufacturing a laminated structure including high-precision and high-density electrode patterns.

Further, according to one embodiment of the present invention, a method can be provided for easily manufacturing a laminated structure including fine electrode patterns without affecting the inside of the element.

Further, according to one embodiment of the present invention, an appropriate method can be provided for manufacturing a laminated structure, making use of the characteristics of the wettability varying layer.

Further, according to one embodiment of the present invention, a method can be provided for easily manufacturing an electronic element such as a field-effect type transistor including fine electrode patterns by a low-cost method at a high material utilization rate, such as a printing method.

Further, according to one embodiment of the present invention, a method can be provided for manufacturing an electronic element such as a field-effect type transistor including high-precision and high-density electrode patterns.

The present invention is not limited to the specifically disclosed embodiment, and variations and expansions may be made without departing from the scope of the present invention.

The present application is based on Japanese Priority Patent Application No. 2006-214684, filed on Aug. 7, 2006, the entire contents of which are hereby incorporated by reference.

The invention claimed is:

1. A laminated structure comprising:

a substrate;

a wettability varying layer formed on the substrate, the wettability varying layer including a material whose critical surface tension is changed by receiving energy; and an electrode layer formed on the wettability varying layer, the electrode layer forming a pattern based on the wettability varying layer, wherein the material whose critical surface tension is changed by receiving energy includes a polymer having a primary chain and a side chain, the side chain including a multi-branched structure, and the polymer having the primary chain and the side chain with the multi-branched structure includes a polyimide, wherein a thickness of the wettability varying layer is in a range of 50 nm to 1 µm.

2. The laminated structure according to claim 1, wherein the multi-branched structure of the side chain in the material whose critical surface tension is changed by receiving energy includes a hydrophobic polymer.

3. An electronic element comprising a substrate on which at least a semiconductor layer, an insulating film layer, and the laminated structure according to claim 1 are formed.

4. The electronic element according to claim 3, wherein the semiconductor layer comprises an organic semiconductor material.

5. The electronic element according to claim 3, further comprising:

a gate insulating film laminated together with the laminated structure.

6. The electronic element according to claim 3, wherein the wettability varying layer also acts as the insulating film layer.

7. The electronic element according to claim 3, wherein the laminated structure is used for a plurality of the electrode layers.

8. An electronic element array comprising a plurality of the electronic elements according to claim 3 arranged on a substrate.

9. A display unit comprising the electronic element array according to claim 8.

10. The laminated structure according to claim 1, wherein the multi-branched structure of the side chain in the material whose critical surface tension is changed by receiving energy is a dendrimer structure.

11. The laminated structure according to claim 1, wherein the multi-branched structure of the side chain in the material whose critical surface tension is changed by receiving energy is a hyperbranched structure.

* * * * *